United States Patent [19]

Wonnacott

[11] Patent Number: 4,501,061
[45] Date of Patent: Feb. 26, 1985

[54] FLUORINE PLASMA OXIDATION OF RESIDUAL SULFUR SPECIES

[75] Inventor: Gerald Wonnacott, Santa Cruz, Calif.

[73] Assignee: Advanced Micro Devices, Inc., Sunnyvale, Calif.

[21] Appl. No.: 499,747

[22] Filed: May 31, 1983

[51] Int. Cl.³ .............................................. C23F 1/02
[52] U.S. Cl. ........................................ 29/591; 29/590; 148/187; 156/643; 156/665
[58] Field of Search .................. 29/591, 590; 156/643, 156/665; 148/187

[56] References Cited

U.S. PATENT DOCUMENTS

| | | | |
|---|---|---|---|
| 4,057,460 | 11/1977 | Saxena et al. | 29/591 |
| 4,233,337 | 11/1980 | Friedman et al. | 29/591 |
| 4,267,012 | 5/1981 | Pierce et al. | 156/643 |
| 4,357,203 | 11/1982 | Zelig | 156/643 |
| 4,357,369 | 11/1982 | Kilichowski et al. | 427/90 |
| 4,371,408 | 2/1983 | Kurosawa | 29/591 |
| 4,374,699 | 2/1983 | Sanders et al. | 156/643 |
| 4,412,885 | 11/1983 | Wang et al. | 156/643 |

OTHER PUBLICATIONS

Suzuki et al., Jap. Jr. Appl. Physics., 16 (1977) 1979.

Primary Examiner—Upendra Roy
Attorney, Agent, or Firm—Patrick T. King; James M. Heslin

[57] ABSTRACT

A method for stripping an organic photoresist layer from a semiconductor device comprises oxidation of the photoresist layer with oxygen plasma and subsequent removal of residual sulfur species using a fluorine-containing plasma.

8 Claims, 6 Drawing Figures

FLUORINE PLASMA OXIDATION OF RESIDUAL SULFUR SPECIES

BACKGROUND OF THE INVENTION

1. Field of the Invention

The present invention relates generally to the manufacture of semiconductor devices, and more particularly to a method for treating such devices to remove residual sulfur species left after oxidation of an organic photoresist layer.

2. Description of the Prior Art

Conventional semiconductor processing requires patterning of an aluminum or aluminum-silicon layer to define conductors, referred to as interconnect lines, between various locations on the device. In order to define the interconnects, a photosensitive organic polymer layer referred to as the photoresist layer, is applied over the aluminum and selectively hardened by photolithographic techniques. The non-hardened areas are then removed by selective solvents, forming a desired pattern in the photoresist layer. The exposed portions of the aluminum layer are then etched, typically using a liquid etchant or chlorine plasma, to define the interconnect lines. Often, a layer of tungsten-titanium is provided intermediate the aluminum and the silicon layers to prevent migration of the aluminum into the silicon. This layer must be patterned corresponding to the overlaying aluminum layer, typically by etching with a liquid oxidant such as hydrogen peroxide.

Prior to etching the titanium-tungsten layer, the organic photoresist layer is stripped from the device, usually by using a phenolic stripper or an oxygen plasma. Each of these methods suffers from certain drawbacks. Use of the phenolic stripper can present health hazards, and its disposal presents environmental problems. The use of the oxygen plasma, although presenting few health hazards and being environmentally acceptable, has been found to leave residual sulfur species on the surface of the device which inhibit removal of the titanium-tungsten layer with the liquid oxidant, usually hydrogen peroxide. The hydrogen peroxide will react with the sulfur to form oxidized species, such as sulfuric acid, which can corrode the aluminum layer. Additionally, such reaction depletes the hydrogen peroxide, thus inhibiting the desired removal of the titanium-tungsten layer.

For these reasons, it would be desirable to provide a convenient method for removal of the sulfur species prior to treatment of the semiconductor device with a liquid oxidant to pattern the titanium-tungsten layer.

SUMMARY OF THE INVENTION

The present invention provides a method for removing residual sulfur species from the surface of a semiconductor device after removal of an organic photoresist layer using an oxygen plasma. Such removal overcomes the problems associated with sulfuric acid formation and depletion of the hydrogen peroxide used to etch the titanium-tungsten layer underlying the aluminum. The residual sulfur species are removed by treatment of the semiconductor device with a fluorine-containing plasma at a point after the photoresist has been stripped (using an oxygen plasma) and prior to etching of the titanium-tungsten layer with hydrogen peroxide. Thus, the environmental benefits of using an oxygen plasma to strip the photoresist can be obtained without the problems heretofore associated with the subsequent stripping of the photoresist.

DESCRIPTION OF THE PREFERRED EMBODIMENTS

Figure 1:
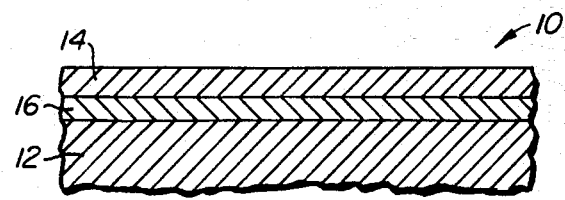
FIGS. 1-6 are cross-sectional views of a portion of a semiconductor device undergoing the processing of the present invention.

Referring to FIGS. 1-6, a specific method will be described for preparing semiconductor devices according to the present invention. A semiconductor device 10 (only a portion of which is illustrated in FIGS. 1-6) includes a silicon wafer substrate 12 and aluminum layer 14 (typically an aluminum-silicon alloy) overlaying the substrate 12, and a titanium-tungsten layer 16 intermediate layers 12 and 14. The titanium-tungsten layer 16 is provided to prevent migration of aluminum from layer 14 into the silicon substrate 12. The preparation of such layered structures is well known in the art of semiconductor manufacture and need not be further described.

Figure 2:
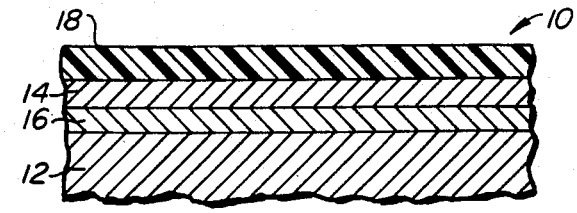

Once the layered structure of FIG. 1 has been prepared, it is necessary to form a preselected pattern of interconnects in the aluminum layer 14 and titanium-tungsten layer 16 so that the appropriate locations on the substrate 12 can be connected. To define such pattern in layers 14 and 16, a layer 18 of an organic photoresist is applied over the top of aluminum layer 14, as illustrated in FIG. 2. The method of applying the photoresist is well known and amply described in the literature.

The present invention relates to the use of positive-acting photoresists where the photosensitive component is sulfur based, usually napthoquinone sulfonic acid esters. Those areas of the photoresist which are exposed to radiation are rendered soluble in selective solvents while those areas which are shaded from the radiation remain resistant to the solvents. Thus, the desired pattern can be imparted to the photoresist layer by exposure to light through a mask (not shown) which shades those areas where it is desired to have interconnects run in the aluminum.

Figure 3:
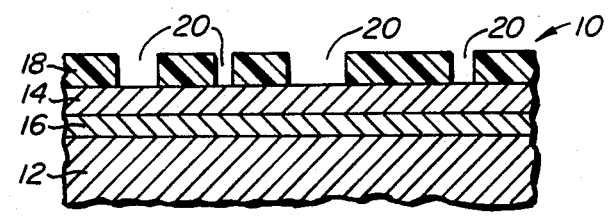
Figure 4:
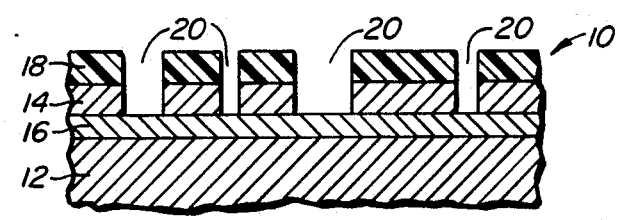
Figure 5:
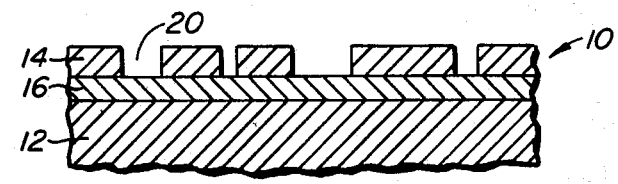

After exposure to radiation through the mask, the photoresist is then developed in the selective solvent, forming a pattern of channels 20 in the photoresist 18, as illustrated in FIG. 3. After heating to further harden the remaining photoresist, the aluminum layer 14 is etched by conventional methods, typically using a chlorine-containing plasma or a liquid acid etchant. After etching the aluminum layer 14, the structure is as illustrated in FIG. 4, with the channels 20 extending through the aluminum layer 14 and terminating at the titanium-tungsten layer 16.

Up until this point, the processing described has been conventional and the techniques are well known in the art. The present invention is directed at a novel method for removing the remaining portions of the photoresist layer 18 and treating the semiconductor device 10 to remove residual sulfur prior to etching the titanium-tungsten layer 16.

After the wet etching to remove the aluminum to form the circuit interconnects, the semiconductor device 10 is rinsed and dried in a well known manner. The device is then placed in a barrel or tube-type plasma reactor and the masking photoresist layer 18 is stripped using an oxygen plasma. The oxygen is then introduced at low pressure, typically at 1 Torr. or below, and a plasma is initiated by an RF current. The resulting dissociated oxygen rapidly oxidizes the photoresist layer 18, and the product gases ($CO$, $CO_2$, and $H_2O$) are removed from the plasma reactor together with the remaining oxygen.

It has been found that oxidation of the photoresist layer using an oxygen plasma, as just described, results in residual sulfur species being left on the surface of the semiconductor device 10. Such species are undesirable since they react with hydrogen peroxide in the subsequent step of etching the titanium-tungsten layer, forming sulfuric acid. Sulfuric acid corrodes the aluminum interconnects which have been formed. Moreover, localized depletion of the hydrogen peroxide can inhibit removal of the titanium-tungsten layer, causing spots of the layer to remain after the etching is complete. The present invention provides for removal of such residual sulfur species by oxidation with a fluorine- containing plasma. Such oxidation results in the formation of gaseous sulfur species, such as sulfur hexafluoride ($SF_6$), which are desorbed into the gas phase in the plasma reactor and easily removed. The fluorine plasma etch has an additional advantage in that it will remove any titanium or tungsten oxides which may have formed on the exposed surface of the titanium-tungsten layer 16. Such oxides can inhibit etching of the layer 16 with hydrogen peroxide.

The fluorine-containing plasma may be generated from a wide variety of fluorine-containing gases, e.g., $SF_6$, $C_2F_6$, $CF_4$, and the like. Usually, a small amount of oxygen gas (being below 20% by weight, usually between 10 and 4% by weight) is included in enhancing the oxidation. The plasma is generated conventionally by applying an RF current under a substantial vacuum in the range of 0.1 to 10 Torr. The treatment is continued for about 0.5 to 5 minutes.

Figure 6:
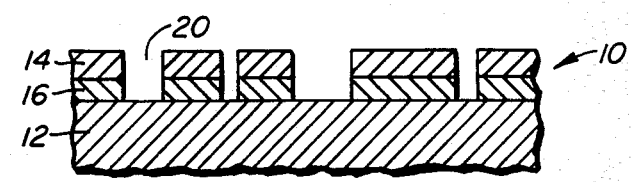

After the treatment just described, the device 10 is etched in hydrogen peroxide free from aluminum corrosion and depletion of the hydrogen peroxide. The resulting structure is illustrated in FIG. 6. The structure is ready for further conventional processing.

According to the present invention, a novel method for stripping an organic photoresist layer from semiconductor devices utilizes an environmentally-acceptable oxygen plasma oxidation. In order to avoid problems associated with residual sulfur species which remain on the surface of the semiconductor device after such etching, the present invention removes such sulfur species using a fluorine-containing plasma. It has been found that the fluorine plasma treatment removes substantially all remaining sulfur species, allowing subsequent etching of the titanium-tungsten layer with hydrogen peroxide free from aluminum corrosion and hydrogen peroxide depletion.

What is claimed is:

1. An improved method for defining interconnect patterns in semiconductor devices having a titanium-tungsten barrier layer intermediate a silicon substrate and an aluminum conductor layer, said barrier layer being resistant to etching with a fluorine-containing plasma, said method including the steps of:
    applying a positive photoresist layer including active sulfur species over the aluminum;
    patterning the photoresist layer to define the desired interconnect pattern;
    etching the aluminum layer in the pattern defined by the photoresist layer;
    stripping the remaining photoresist layer using an oxygen plasma whereby residual sulfur species are left on the aluminum; and
    etching the titanium-tungsten layer in the pattern defined by the photoresist and aluminum layers with a liquid oxidant;
    wherein the improvement comprises exposing the semiconductor device to a fluorine-containing plasma to remove said residual sulfur species without substantially affecting the titanium-tungsten barrier layer prior to etching the titanium-tungsten layer.

2. An improved method for defining interconnect patterns as in claim 1, wherein the titanium-tungsten layer is etched with hydrogen peroxide.

3. An improved method for defining interconnect patterns as in claim 1, wherein the fluorine-containing plasma further includes oxygen at a concentration below 20 weight percent.

4. An improved method for defining interconnect patterns as in claim 3, wherein the fluorine-containing plasma is formed from a mixture of a fluorocarbon and oxygen by applying an RF current under a substantial vacuum.

5. A method for removing residual sulfur species resulting from the oxidation of a positive photoresist layer using an oxygen plasma from the surface of a semiconductor device prior to treatment of said device with a liquid oxidant, said method comprising exposing the device to a fluorine-containing plasma so that the sulfur species are oxidized into a gaseous species which is desorbed from the surface.

6. A method as in claim 5, wherein the liquid oxidant is hydrogen peroxide.

7. A method as in claim 5, wherein the fluorine-containing plasma further includes oxygen at a concentration below 20 weight percent.

8. A method as in claim 7, wherein the fluorine-containing plasma is formed from a mixture of a fluorocarbon and oxygen by applying an RF current under a substantial vacuum.

* * * * *